(12) United States Patent
Raravikar et al.

(10) Patent No.: US 7,713,858 B2
(45) Date of Patent: May 11, 2010

(54) CARBON NANOTUBE-SOLDER COMPOSITE STRUCTURES FOR INTERCONNECTS, PROCESS OF MAKING SAME, PACKAGES CONTAINING SAME, AND SYSTEMS CONTAINING SAME

(75) Inventors: Nachiket Raravikar, Chandler, AZ (US); Daewoong Suh, Phoenix, AZ (US)

(73) Assignee: Intel Corporation, Santa Clara ( * ) Notice: Subject to any disclaimer, the term of this patent is extended or adjusted under 35 U.S.C. 154(b) by 20 days.

(21) Appl. No.: 11/394,904

(22) Filed: Mar. 31, 2006

(65) Prior Publication Data

US 2007/0228361 A1    Oct. 4, 2007

(51) Int. Cl.
*H01L 21/44* (2006.01)
(52) U.S. Cl. ............ 438/612; 438/613; 438/614; 438/615; 438/666; 438/962; 257/621; 257/698; 257/734; 257/737; 257/738; 257/E23.011; 257/E23.02; 257/E23.021; 257/E23.023; 257/E23.03; 257/E23.074; 257/E21.508
(58) Field of Classification Search .......... 977/742; 257/E51.04
See application file for complete search history.

(56) References Cited

U.S. PATENT DOCUMENTS

| | | | |
|---|---|---|---|
| 6,129,901 A * | 10/2000 | Moskovits et al. | 423/447.3 |
| 6,283,812 B1 * | 9/2001 | Jin et al. | 445/24 |
| 6,340,822 B1 | 1/2002 | Brown et al. | |
| 7,135,773 B2 * | 11/2006 | Furukawa et al. | 257/758 |
| 2004/0180521 A1 * | 9/2004 | Joly | 438/585 |
| 2004/0233649 A1 | 11/2004 | Honlein et al. | |
| 2005/0048697 A1 | 3/2005 | Uang et al. | |
| 2006/0289968 A1 * | 12/2006 | Sulfridge | 257/621 |
| 2007/0155136 A1 * | 7/2007 | Chrysler et al. | 438/478 |

OTHER PUBLICATIONS

Hu et al "Growth of well-aligned carbon nanotube arrays on silicon substrates using porous alumina film as a nanotemplate" Applied Physics Letters 79(2001): 3083-3085.*
Krishnan, R., et al., "Wafer-Level Ordered Arrays of Aligned Carbon Nanotubes With Controlled Size and Spacing on Silicon", *Nanotechnology*, 16, (2005), 841-845.
Suh, D., et al., "Nanostructure-Based Package Interconnect", U.S. Appl. No. 11/315,532, filed Dec. 22, 2005.
International Search Report and Written Opinion for PCT Patent Application No. PCT/US2007/008037, mailed on Oct. 1, 2007, 11 pages.
International Preliminary Report on Patentability for PCT Patent Application No. PCT/US2007/008037, mailed on Oct. 9, 2008, 7 pages.

* cited by examiner

*Primary Examiner*—Minh-Loan T Tran
*Assistant Examiner*—Fei Fei Yeung Lopez
(74) *Attorney, Agent, or Firm*—John N. Greaves

(57) ABSTRACT

A carbon nanotube (CNT) array is patterned on a substrate. The substrate can be a microelectronic die, an interposer-type structure for a flip-chip, a mounting substrate, or a board. The CNT array is patterned by using a patterned metallic seed layer on the substrate to form the CNT array by chemical vapor deposition. The patterned CNT array can also be patterned by using a patterned mask on the substrate to form the CNT array by growing. A computing system that uses the CNT array for heat transfer from the die is also used.

20 Claims, 11 Drawing Sheets

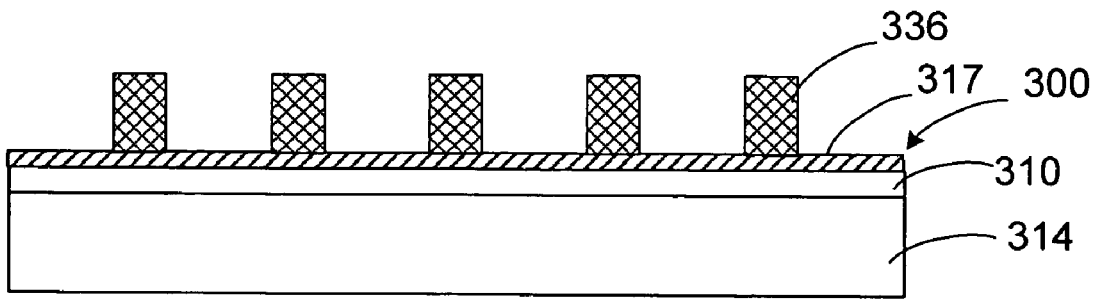
FIG. 3A
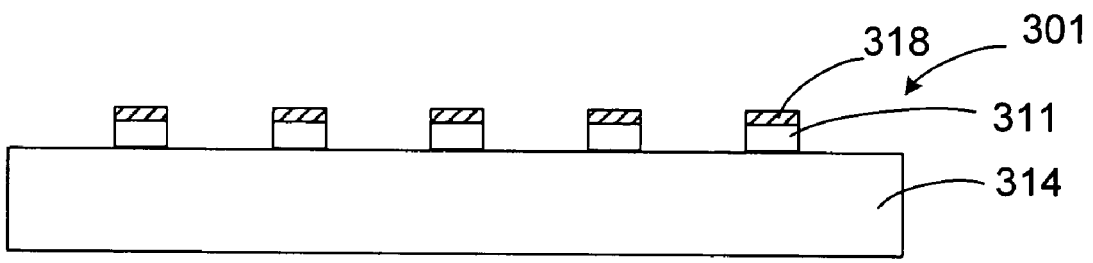
FIG. 3B
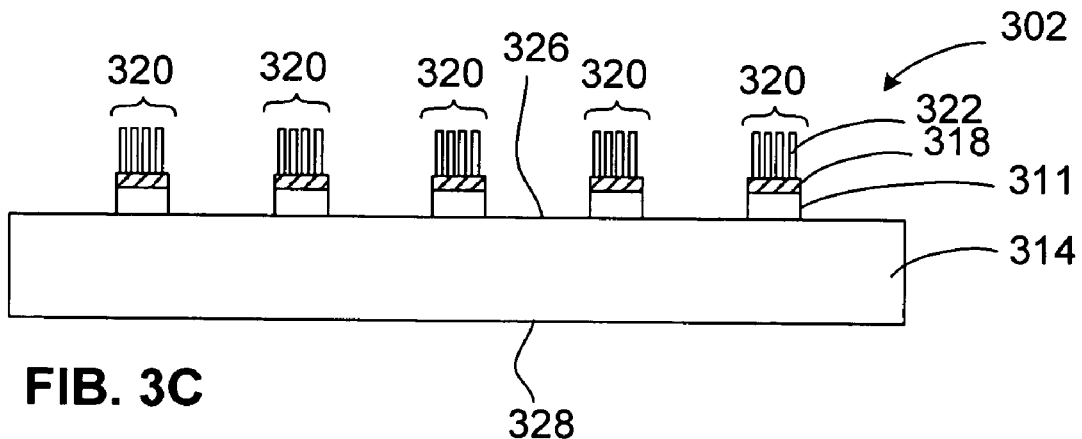
FIB. 3C

CARBON NANOTUBE-SOLDER COMPOSITE STRUCTURES FOR INTERCONNECTS, PROCESS OF MAKING SAME, PACKAGES CONTAINING SAME, AND SYSTEMS CONTAINING SAME

TECHNICAL FIELD

The disclosure relates to an interconnect between a semiconductive die and a substrate.

BRIEF DESCRIPTION OF THE DRAWINGS

In order to depict the manner in which the embodiments are obtained, a more particular description of embodiments briefly described above will be rendered by reference to exemplary embodiments that are illustrated in the appended drawings. These drawings depict typical embodiments that are not necessarily drawn to scale and are not therefore to be considered to be limiting of its scope. The embodiments will be described and explained with additional specificity and detail through the use of the accompanying drawings in which:

FIG. 3A is a cross-section elevation of a structure during processing of a CNT array for an electrical bump according to an embodiment;

FIG. 3B is a cross-section elevation of the structure depicted in FIG. 3A of the CNT array for an electrical bump according to an embodiment;

FIG. 3C is a cross-section elevation of the structure depicted in FIG. 3B of the CNT array after growing the CNT array upon the metallic seed layer according to an embodiment;

DETAILED DESCRIPTION

Electrical bumps are used in microelectronic devices to convey both power and communicative electrical current.

The following description includes terms, such as upper, lower, first, second, etc., that are used for descriptive purposes only and are not to be construed as limiting. The embodiments of a device or article described herein can be manufactured, used, or shipped in a number of positions and orientations. The terms "die" and "chip" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials. A board is typically a resin-impregnated fiberglass structure that acts as a mounting substrate for the die.

Reference will now be made to the drawings wherein like structures will be provided with like reference designations. In order to show the structure and process embodiments most clearly, the drawings included herein are diagrammatic representations of embodiments. Thus, the actual appearance of the fabricated structures, for example in a photomicrograph, may appear different while still incorporating the essential structures of embodiments. Moreover, the drawings show only the structures necessary to understand the embodiments. Additional structures known in the art have not been included to maintain the clarity of the drawings.

Figure 1A:
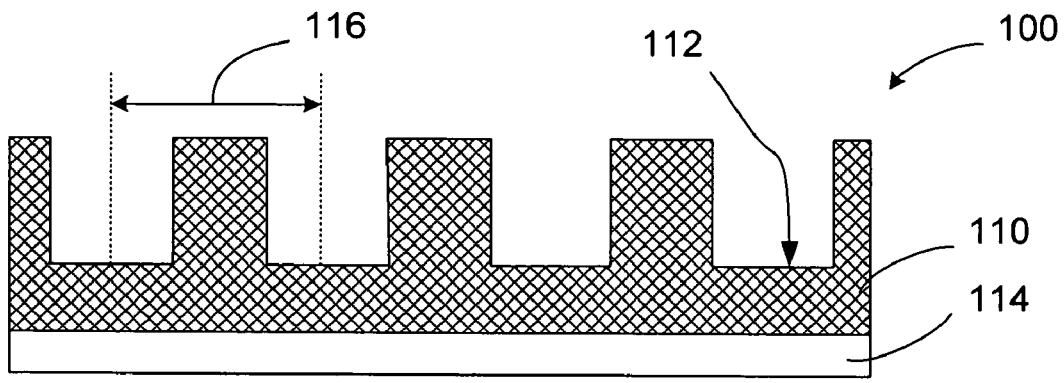
FIG. 1A is a cross-section elevation of a structure during processing of a carbon nanotube (CNT) array in an electrical bump according to an embodiment.

FIG. 1A is a cross-section elevation of a structure 100 during processing of a carbon nanotube (CNT) array in an electrical bump according to an embodiment. A substrate 110 has been patterned with several recesses, one of which is designated with the reference numeral 112. In an embodiment, the substrate 110 has been strengthened with a backing 114. In an embodiment, the backing 114 is a foundation upon which the substrate has grown. For example, an anodized aluminum oxide (AAO) substrate 110 has been grown upon the backing 114. In this embodiment, patterning of the various recesses 112 is dependent upon processing conditions, such that spacing 116 between recesses 112 on centers, is in a range from about 80 nanometer (nm) to about 140 nm. In an embodiment, spacing 116 is about 125 nm.

Figure 1B:
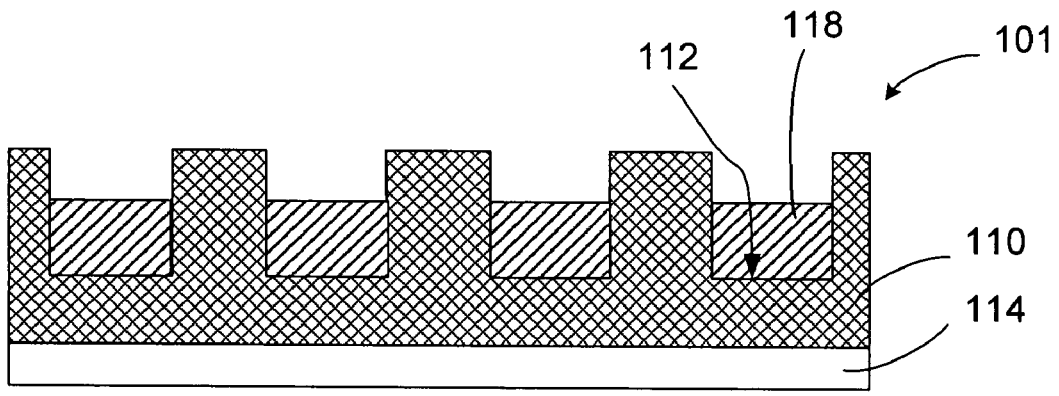
FIG. 1B is a cross-section elevation of the structure depicted in FIG. 1A of the CNT array after forming a metallic seed layer according to an embodiment.

FIG. 1B is a cross-section elevation of the structure 101 depicted in FIG. 1A after forming a metallic seed layer 118 according to an embodiment. In an embodiment, the metallic seed layer 118 has been formed by physical vapor deposition (PVD) to a thickness in a range from about 50 nm to about 1,000 nm. In an embodiment, the metallic seed layer 118 is copper (Cu). In an embodiment, the metallic seed layer 118 is nickel (Ni). In an embodiment, the metallic seed layer 118 is cobalt (Co). In an embodiment, the metallic seed layer 118 is a refractory metal. A refractory metal can be defined as a metal such as, for example, tungsten, molybdenum, tantalum, niobium, chromium, vanadium, and rhenium. A refractory metal can also be defined as a metal having a melting point above the range for iron, cobalt, and nickel.

The structure 101 has been formed with the metallic seed layer 118 that is a metal that is conducive to the growth of a carbon nanotube, such as during chemical vapor deposition (CVD) according to an embodiment. In an embodiment, the metallic seed layer 118 is formed by PVD so as to pattern to the bottom of the recess 112. In an embodiment, the metallic seed layer 118 is electro deposited into the recess 112.

Figure 1C:
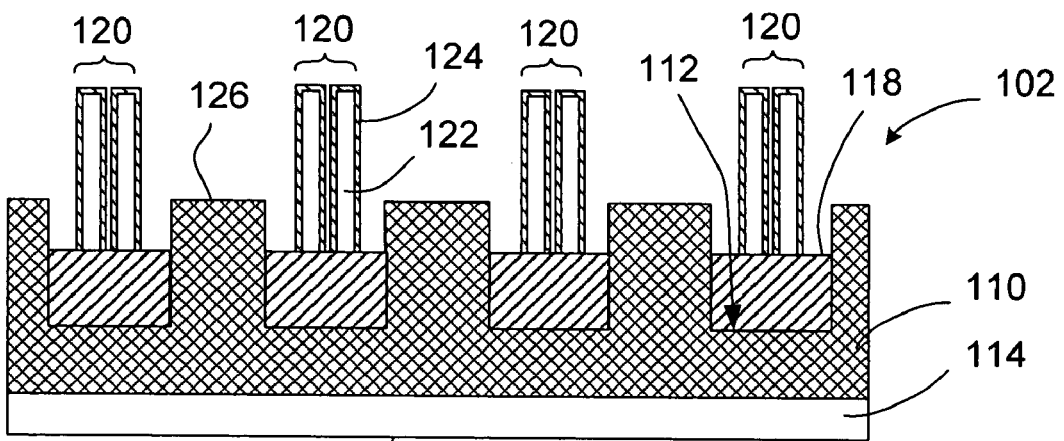
FIG. 1C is a cross-section elevation of the structure depicted in FIG. 1B of the CNT array after growing the CNT array according to an embodiment.

FIG. 1C is a cross-section elevation 102 of the structure depicted in FIG. 1B of the cut after growing a CNT array 120 according to an embodiment. The structure 102 includes the CNT array 120 depicted in a simplified manner with only two carbon nanotubes for clarity. In an embodiment, growing the CNT array 120 is carried out by CVD of carbon onto the metallic seed layer 118. In an embodiment during CVD growth of the individual carbon nanotubes 122, a given CNT 122 is grown in a length range from about 1 µm to about 100 µm. The width of a given CNT 122 is in a range from about 15 nm to about 25 nm.

After growing the CNT array 120 onto the metallic seed layer 118, the process may proceed to grow a thin metallic film 124 onto the CNT array 120 according to an embodiment. In an embodiment, a low contact-resistance metal is used as the thin metallic film 124. In an embodiment, a chromium-containing metal is used as the thin metallic film 124. In an embodiment, a titanium-containing metal is used as the thin metallic film 124. In an embodiment, a nickel-containing metal is used as the thin metallic film 124. In an embodiment, a silver-containing metal is used as the thin metallic film 124. In an embodiment, a combination or alloy of any two or more of the above low contact-resistance metals is used as the thin metallic film 124. Hereinafter the thin metallic film 124 is not reproduced for clarity, but it is present according to an embodiment.

In an embodiment, the substrate 110 includes a substrate first surface 126 and a substrate second surface 128. In the embodiment depicted in FIG. 1C the substrate second surface 128 is an unoxdized material and the substrate 110 is AAO.

Figure 1D:
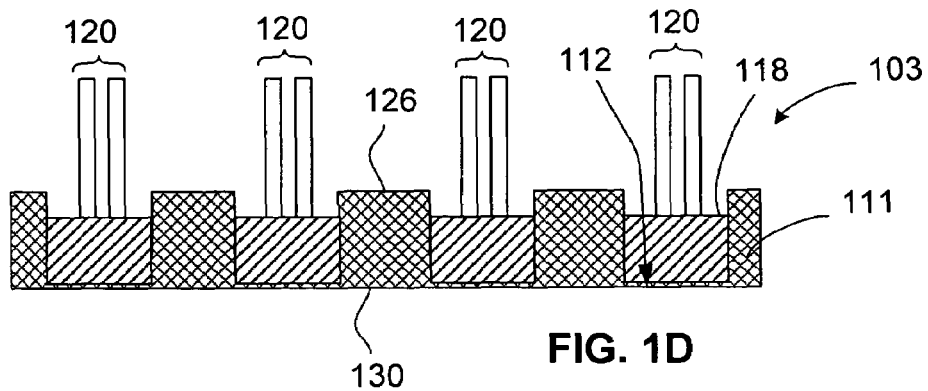
FIG. 1D is a cross-section elevation of the structure depicted in FIG. 1C of the CNT array after exposing the metallic seed layer from the substrate second surface according to an embodiment.

FIG. 1D is a cross-section elevation of the structure depicted in FIG. 1C of the CNT array 120 after further processing according to an embodiment. The structure 103 is depicted after exposing the metallic seed layer 118 through the substrate second surface 128 depicted in FIG. 1C. In an embodiment, the substrate second surface 128 is removed by backgrinding. In an embodiment, the substrate second surface 128 is removed by etching. In an embodiment, the substrate second surface 128 is removed by polishing. A substrate subsequent second surface 130 is now opposite and parallel planar with the substrate first surface 126, and the metallic seed layer 118 is exposed on both sides of what has become the reduced-thickness substrate 111. Consequently, the metallic seed layer 118 is ready for electrical contact at the substrate subsequent second surface 130.

Figure 1E:
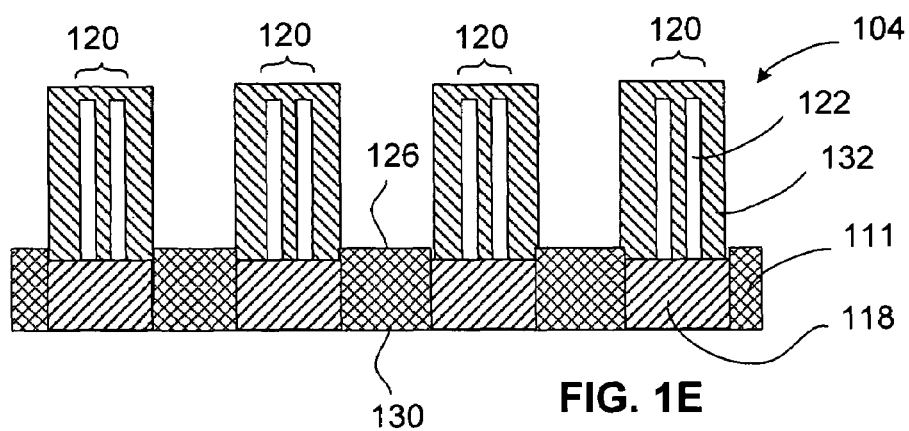
FIG. 1E is a cross-section elevation of the structure depicted in FIG. 1D of the CNT array after patterning an electrical bump precursor according to an embodiment.

FIG. 1E is a cross-section elevation of the structure after further processing according to an embodiment. The structure 104 exhibits a reduced-thickness substrate 111 depicted in FIG. 1D after patterning of an electrical bump precursor 132 according to an embodiment. The electrical bump precursor 132 is a solder paste which has been screen printed upon the metallic seed layer 118 according to an embodiment. In an embodiment, the electrical bump precursor 132 is a CVD-formed solder that has not substantially disturbed the CNT array 120. Sufficient solder in the electrical bump precursor 132 is supplied such that when reflow of the electrical bump precursor 132 occurs, an electrical bump height will be achieved that suits a given application.

Figure 1F:
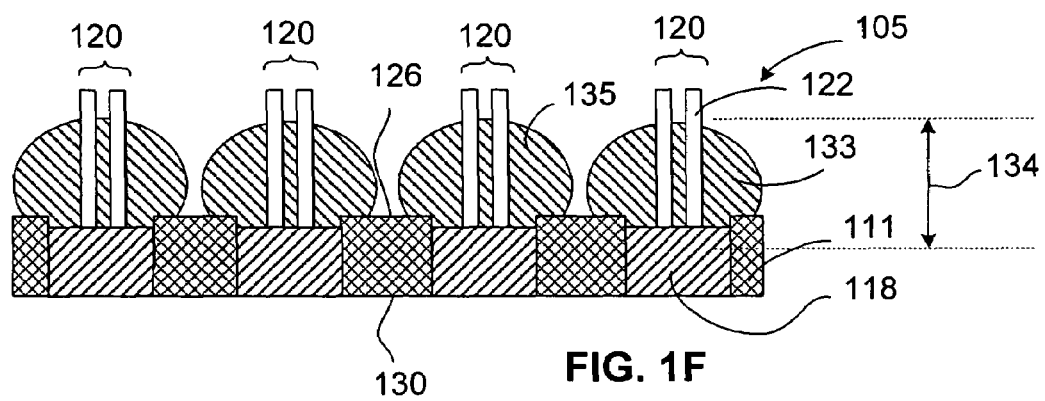
FIG. 1F is a cross-section elevation of the structure depicted in FIG. 1E of the CNT array after reflowing the electrical bump precursor according to an embodiment.

FIG. 1F is a cross-section elevation of the structure depicted in FIG. 1E after further processing according to an embodiment. The structure 105 exhibits the reduced-thickness substrate 111 after reflowing the electrical bump precursor 132 according to an embodiment. The reflowed electrical bump 133 has a sufficient bump height 134 to suit a given application of the technology. The bump height is measured beginning at the metallic seed layer 118. FIG. 1F also depicts an anisotropic CNT array 120 that is impregnated with the reflowed electrical bump 133. In an embodiment, the reflowed electrical bump 133 is referred to as a first electrical bump, and the article depicted in FIG. 1F includes a second electrical bump 135 that is spaced apart and adjacent from the first electrical bump 133. Consequently, the first electrical bump 133 and the second electrical bump 135 are part of a ball array.

Figure 2A:
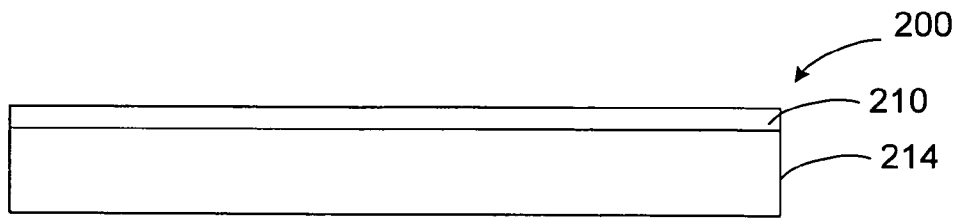
FIG. 2A is a cross-section elevation of a structure during processing of a CNT array for an electrical bump according to an embodiment.

FIG. 2A is a cross-section elevation of a structure 200 during processing of a CNT array for an electrical bump according to an embodiment. A support substrate 214 is provided and it is any surface that can support a substrate 210 such as a dielectric material according to an embodiment.

Figure 2B:
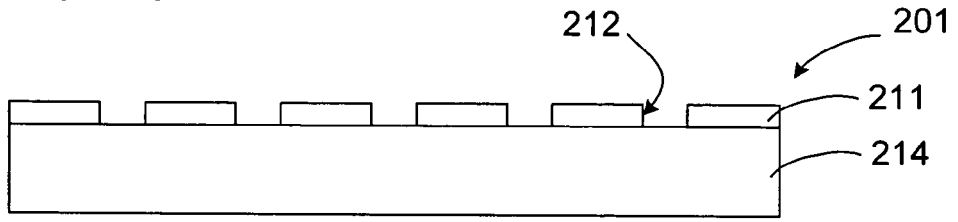
FIG. 2B is a cross-section elevation of the structure depicted in FIG. 2A of the CNT array after further processing according to an embodiment

FIG. 2B is a cross-section elevation of the structure depicted in FIG. 2A after further processing according to an embodiment. The structure 201 exhibits the substrate 211 after it has been patterned with several recesses, one of which is designated with the reference numeral 212. In an embodiment, the substrate 211 remains strengthened with the support substrate 214 as a backing.

Figure 2C:
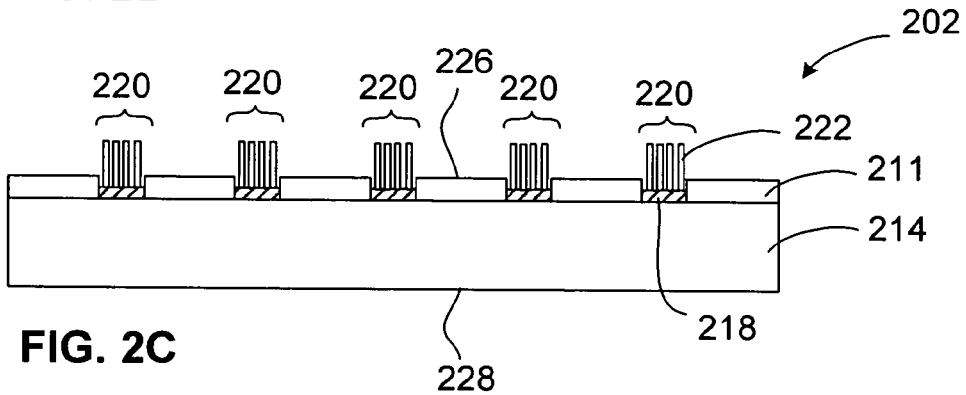
FIG. 2C is a cross-section elevation of the structure depicted in FIG. 2B of the CNT array after growing the CNT array upon the metallic seed layer according to an embodiment.

FIG. 2C is a cross-section elevation of the structure depicted in FIG. 2B after further processing according to an embodiment. The structure 202 exhibits the result of growing a CNT array 220 upon a metallic seed layer 218. The metallic seed layer 218 is a metal that is conducive to the growth of a carbon nanotube, such as during CVD according to an embodiment. In various embodiments, any of the metallic seed layer embodiments depicted and described for the embodiments set forth for FIGS. 1A though 1E can be used.

In an embodiment, the metallic seed layer 218 is formed by PVD so as to pattern to the bottom of the recess 212. In an embodiment, the metallic seed layer 218 is electro deposited into the recess 212.

The CNT array 220 is depicted in simplified manner with only four carbon nanotubes 222 for clarity. In an embodiment, growing the CNT array 220 is carried out by CVD of carbon onto the metallic seed layer 118. In an embodiment during CVD growth of the individual carbon nanotubes 222, a given CNT 222 is grown in a length range from about 1 μm to about 100 μm. The width of a given CNT 222 is in a range from about 15 nm to about 25 nm.

After growing the CNT array 220 onto the metallic seed layer 218, the process may proceed to grow a thin metallic film such as the thin metallic film 124 depicted in FIG. 1C, but not rendered here for clarity. In an embodiment, a low contact-resistance metal is used as the metallic thin film. Any low contact-resistance metal can be used such as the described and illustrated embodiments set forth for the CNT array 120 depicted in FIGS. 1A through 1E according to an embodiment.

In an embodiment, the substrate 211 includes a substrate first surface 226 and a substrate second surface 228. In the embodiment depicted in FIG. 2C the substrate second surface 228 is part of the support 214.

Figure 2D:
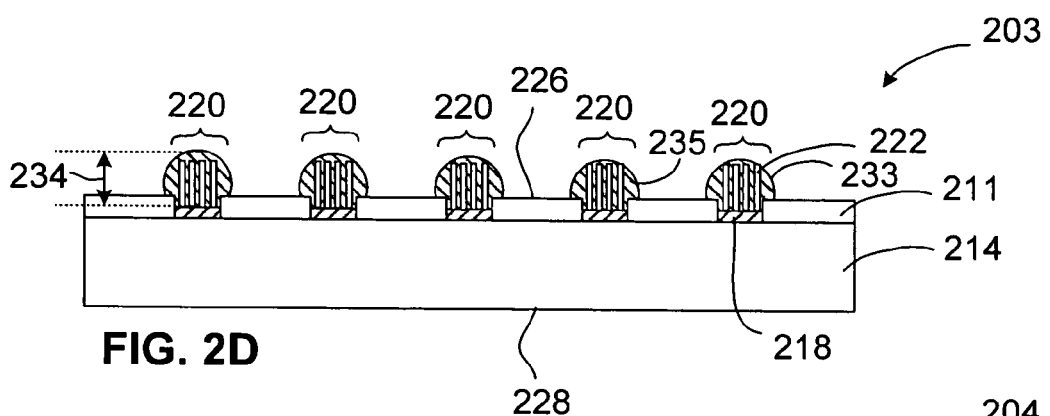
FIG. 2D is a cross-section elevation of the structure depicted in FIG. 2C of the CNT array for an electrical bump after reflow of the electrical bump according to an embodiment.

FIG. 2D is a cross-section elevation of the structure depicted in FIG. 2C after further processing according to an embodiment. The structure 203 exhibits the CNT array 220 for an electrical bump after reflow of the electrical bump 233. In contrast to the process depicted in FIGS. 1A through 1E, the process illustrates reflowing before exposing the metallic seed layer 124 depicted in FIG. 1C according to an embodiment. In an embodiment, thickness reduction can precede reflow. In an embodiment, thickness reduction can follow reflow.

The reflowed electrical bump 233 has sufficient bump height 234 to suit a given application of the technology. FIG. 2D also depicts an anisotropic CNT array 220 that is impregnated with the reflowed electrical bump 233.

In an embodiment, the reflowed electrical bump 233 is referred to as a first electrical bump, and the article depicted in FIG. 2D includes a second electrical bump 235 that is spaced apart and adjacent from the first electrical bump 233. Consequently, the first electrical bump 233 and the second electrical bump 235 are part of a ball array.

Figure 2E:
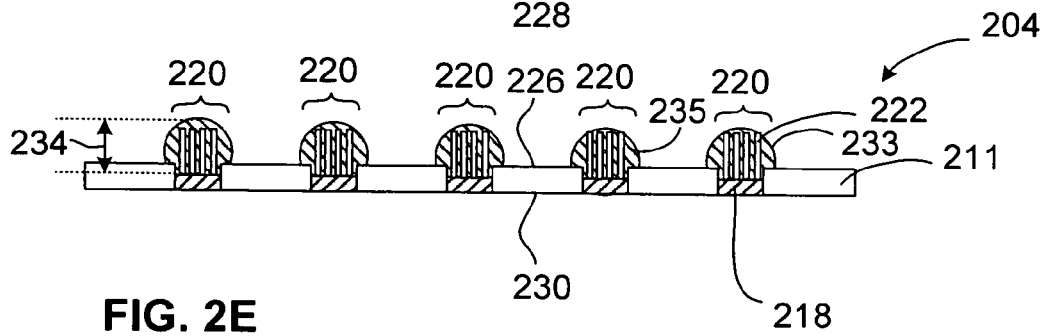
FIG. 2E is a cross-section elevation of the structure depicted in FIG. 2D of the CNT array for a metal bump during processing according to an embodiment.

FIG. 2E is a cross-section elevation of the structure depicted in FIG. 2D after further processing according to an embodiment. The structure 204 exhibits a reduced-thickness substrate 211 after exposing the metallic seed layer 218 through the substrate second surface 228 (FIG. 2D) according to an embodiment. A substrate subsequent second surface 230 is now opposite and parallel planar with the substrate first surface 226, and the metallic seed layer 218 is exposed on both sides of the reduced-thickness substrate 211. Consequently, the metallic seed layer 218 is ready for electrical contact at the substrate subsequent second surface 230.

FIG. 3A is a cross-section elevation of a structure 300 during processing of a CNT array for an electrical bump according to an embodiment. A support substrate 314 is provided and it is any surface that can support a substrate 310 such as a dielectric material according to an embodiment. In an embodiment, the support substrate 314 is a polysilicon material. In an embodiment, the support substrate 314 is a monocrystalline silicon material.

Processing has included forming a substrate 310 and a metallic seed film 317, which will be patterned to form a metallic seed layer 318 (FIG. 3B). In an embodiment, the metallic seed film 317 is formed by PVD. In an embodiment, the metallic seed film 317 is formed by CVD. In an embodiment, the metallic seed film 317 is electro deposited such as by electroplating. A mask 336 has been patterned upon the metallic seed film 317.

FIG. 3B is a cross-section elevation of the structure depicted in FIG. 3A after further processing according to an embodiment. The structure 301 includes a substrate that has been patterned as several prominences, one of which is designated with the reference numeral 311. In an embodiment, the substrate 311 remains strengthened with the support substrate 314 as a backing. The metallic seed film 317 has also been patterned to form a plurality of metallic seed layers, one of which is designated with the reference numeral 318. The metallic seed layer 318 is a metal that is conducive to the growth of a carbon nanotube, such as during CVD according to an embodiment. Any of the metallic seed layer embodiments depicted and described for the embodiments set forth in this disclosure can be used in this embodiment.

FIG. 3C is a cross-section elevation of the structure depicted in FIG. 3B after further processing according to an embodiment. The structure 302 exhibits a substrate 311 after growing a CNT array 320 upon the metallic seed layer 318. The CNT array 320 is depicted in simplified manner with only four carbon nanotubes 322 for clarity. In an embodiment, growing the CNT array 320 is carried out by CVD of carbon onto the metallic seed layer 318. In an embodiment during CVD growth of the individual carbon nanotubes 322, a given CNT 322 is grown in a length range from about 1 μm to about 100 μm. The width of a given CNT 322 is in a range from about 15 nm to about 25 nm.

After growing the CNT array 320 onto the metallic seed layer 318, the process may proceed to grow a thin metallic film such as the thin metallic film 124 depicted in FIG. 1C, but not rendered here for clarity. In an embodiment, a low contact-resistance metal is used as the thin metallic film. Any low contact-resistance metal can be used such as the described and illustrated embodiments set forth for any CNT array in this disclosure according to an embodiment.

In an embodiment, the structure 302 includes a substrate first surface 326 and a substrate second surface 328. In the embodiment depicted in FIG. 3C the substrate second surface 328 is part of the support 314.

Figure 3D:
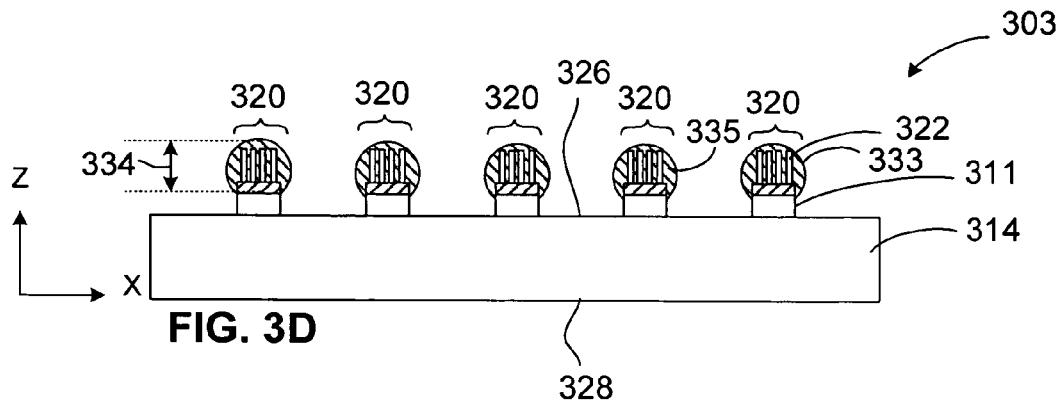
FIG. 3D is a cross-section elevation of the structure depicted in FIG. 3C of the CNT array for an electrical bump after reflow of the electrical bump according to an embodiment.

FIG. 3D is a cross-section elevation of the structure depicted in FIG. 3C after further processing according to an embodiment. The structure 303 exhibits the substrate 311 with the CNT array 320 for an electrical bump after reflow of the electrical bump 333. The reflowed electrical bump 333 has sufficient bump height 334 to suit a given application of the technology. FIG. 3D also depicts an anisotropic CNT array 320 that is impregnated with the reflowed electrical bump 333.

In an embodiment, the reflowed electrical bump 333 is referred to as a first electrical bump, and the article depicted in FIG. 3D includes a second electrical bump 335 that is spaced apart and adjacent from the first electrical bump 333. Consequently, the first electrical bump 333 and the second electrical bump 335 are part of a ball array.

Figure 3E:
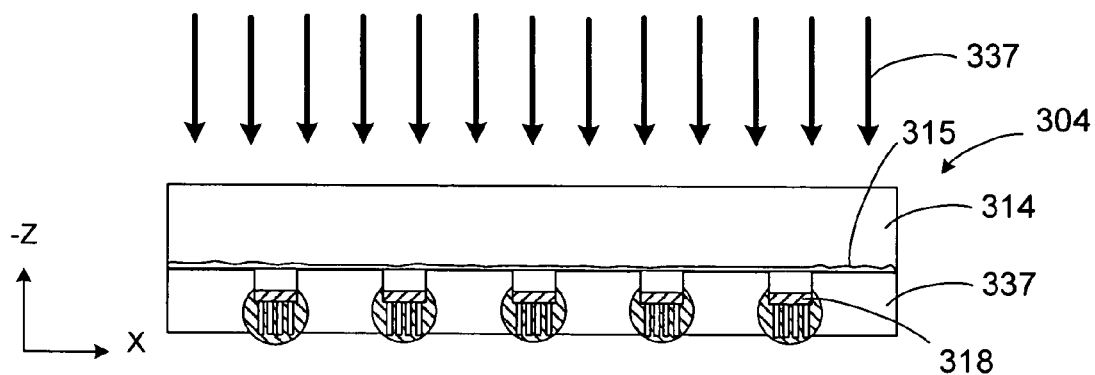
FIG. 3E is a cross-section elevation of the structure depicted in FIG. 3D of the CNT array during backside reduction processing according to an embodiment.

FIG. 3E is a cross-section elevation of the structure depicted in FIG. 3D after further processing according to an embodiment. The structure 304 exhibits the results of the formation of a second support substrate and of an embrittlement process in the original support substrate 314. Embrittlement is carried out by first implanting followed by second heating. In an embodiment, the implantation into the support 314, of hydrogen ions 337 (depicted as directional arrows) for example, is carried out at a density approximately ranging between $5 \times 10^{16}/cm^2$ and $10^{17}/cm^2$. The ions 337 are implanted to terminate at or near the metallic seed layer 318 to form a fracture line 315.

Figure 3F:
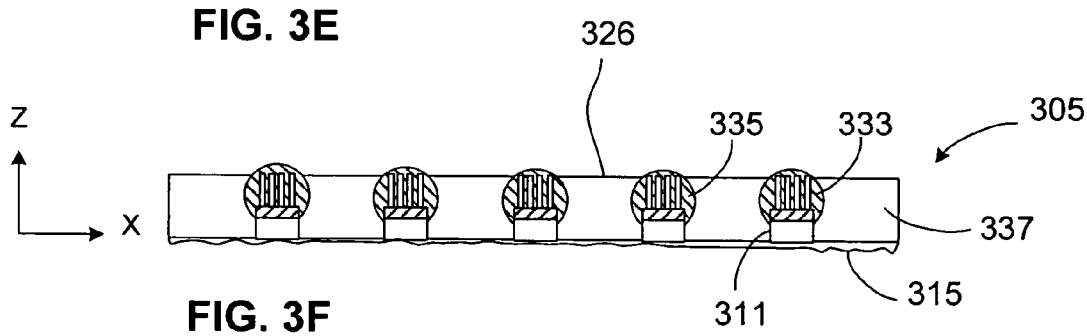
FIG. 3F is a cross-section elevation of the structure depicted in FIG. 3E of the CNT array during backside reduction processing according to an embodiment.

FIG. 3F is a cross-section elevation of the structure depicted in FIG. 3E after further processing according to an embodiment. The structure 305 exhibits the results of the embrittlement process. After implantation, the structure 305 is heated. When the temperature of the structure 305 reaches approximately 400° C., most or all of the support substrate 314 splits off or in other words, is "debonded" from rest of the structure 305 at the fracture line 315.

Figure 3G:
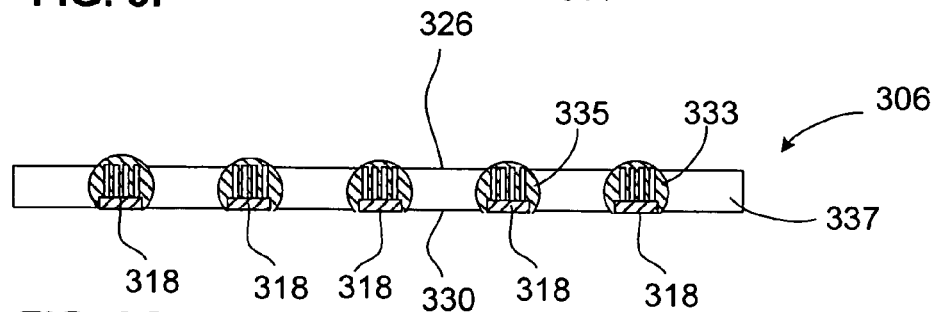
FIG. 3G is a cross-section elevation of the structure depicted in FIG. 3F of the CNT array during backside reduction processing according to an embodiment.

FIG. 3G is a cross-section elevation of the structure depicted in FIG. 3F after further processing according to an embodiment. The structure 306 exhibits the result of planarizing to remove the substrate 311 (FIG. 3F) and to further expose the electrical bumps 333 on both sides. The substrate subsequent second surface 330 is now opposite and parallel planar with the substrate first surface 326, and the metallic seed layer 318 is exposed at the subsequent second surface 330.

In an embodiment, the reflowed electrical bump 333 is referred to as a first electrical bump, and the article depicted in FIG. 3G includes a second electrical bump 335 that is spaced apart and adjacent from the first electrical bump 333. Consequently, the first electrical bump 333 and the second electrical bump 335 are part of a ball array.

Figure 4:
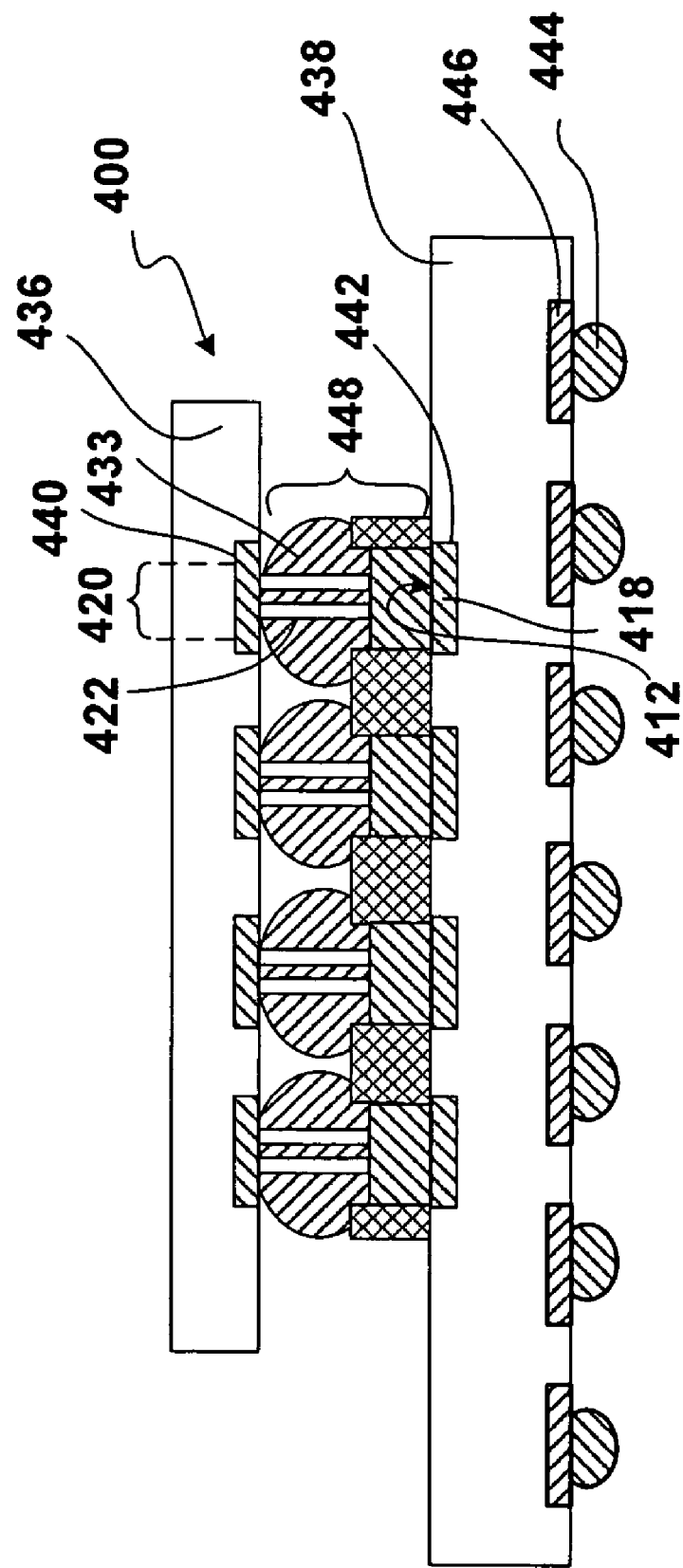
FIG. 4 is a cross-section elevation of a package that contains a CNT array in an electrical bump according to an embodiment.

FIG. 4 is a cross-section elevation of a package 400 that contains a CNT array in an electrical bump according to an embodiment. The package 400 includes a die 436 that is flip-chip bonded to a mounting substrate 438. A die bond pad 440 and a mounting substrate bond pad 442 are also depicted. The mounting substrate 438 is also bumped with a board-side electrical bump 444, which is in contact with a board-side bond pad 446.

Figure 5:
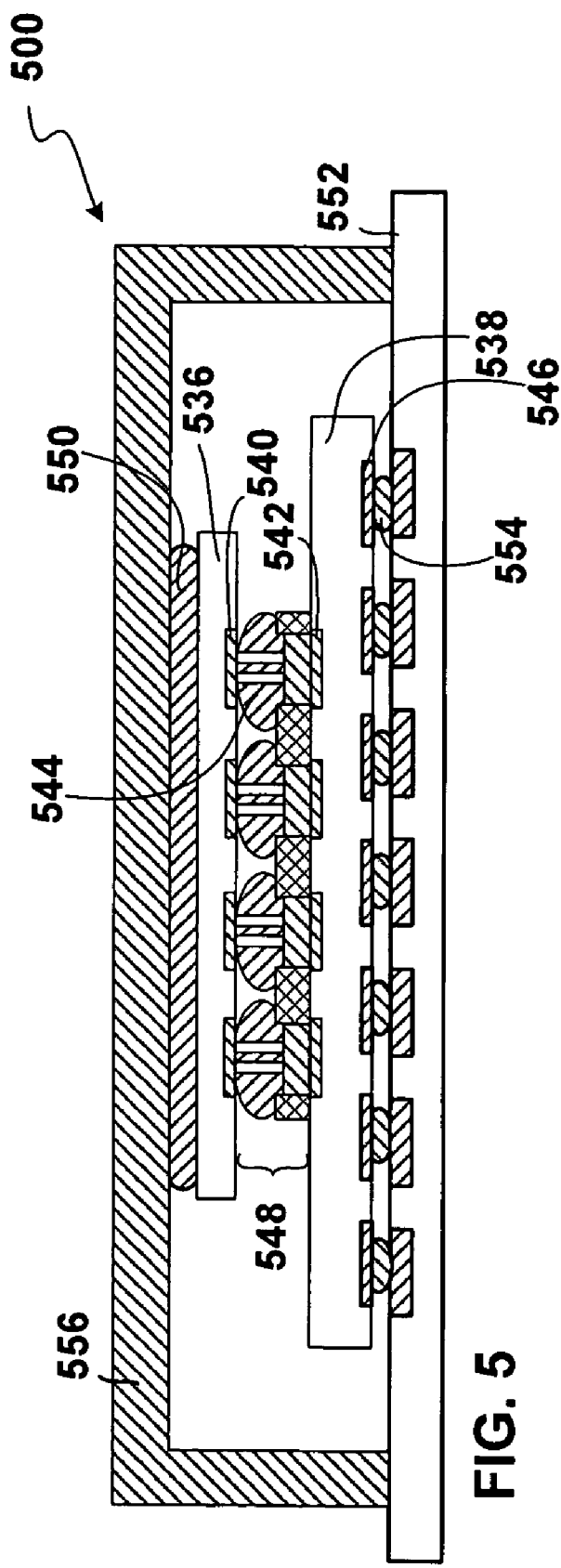
FIG. 5 is a cross-section elevation of an integrated heat-spreader package that contains a CNT array in an electrical bump according to an embodiment.

An interposer structure 448 is disposed between the die 436 and the mounting substrate 438. The interposer structure 448 is fabricated according to a process embodiment set forth in this disclosure. In an embodiment, the interposer structure 448 resembles the structure 105 depicted in FIG. 1F. Accordingly, the interposer structure 448 includes a metallic seed layer 418 patterned into the bottom of a recess 412. The interposer structure 448 includes a CNT array 420 depicted in simplified manner with only two carbon nanotubes for clarity. In an embodiment for the individual carbon nanotubes 422, a given CNT 422 is grown in a length range from about 1 μm to about 100 μm. The width of a given CNT 422 is in a range from about 15 nm to about 25 nm. The reflowed electrical bump 433 has a sufficient bump height to suit a given application of the technology FIG. 5 is a cross-section elevation of an integrated heat-spreader package 500 that contains a CNT array in an electrical bump according to an embodiment. The package 500 includes a die 536 that is flip-chip bonded to a mounting substrate 538. A die bond pad 540 and a mounting substrate bond pad 542 are also depicted. The mounting substrate 538 is also bumped with a board-side electrical bump 544, which is in contact with a board-side bond pad 546. Further, the mounting substrate 538 is electrically coupled to a board 552 through a board electrical bump 554. An integrated heat spreader (IHS) 556 is coupled to the die 536 at the backside with a thermal-interface material (TIM) 550.

An interposer structure 548 is disposed between the die 536 and the mounting substrate 538. The interposer structure 548 is fabricated according to a process embodiment. In an embodiment, the interposer structure 548 resembles the structure 105 depicted in FIG. 1F. Accordingly, the interposer structure 548 includes a metallic seed layer patterned into the bottom of a recess. The interposer structure 548 includes a CNT array depicted in simplified manner with only two carbon nanotubes for clarity. In an embodiment for the individual carbon nanotubes, a given CNT is grown in a length range from about 1 μm to about 100 μm. The width of a given CNT is in a range from about 15 nm to about 25 nm.

In an embodiment, the board-side electrical bump 554 also contains a CNT array that facilitates both current density and heat transfer. In an embodiment, the TIM 550 also contains a CNT array that facilitates heat transfer into the IHS 556.

Figure 6:
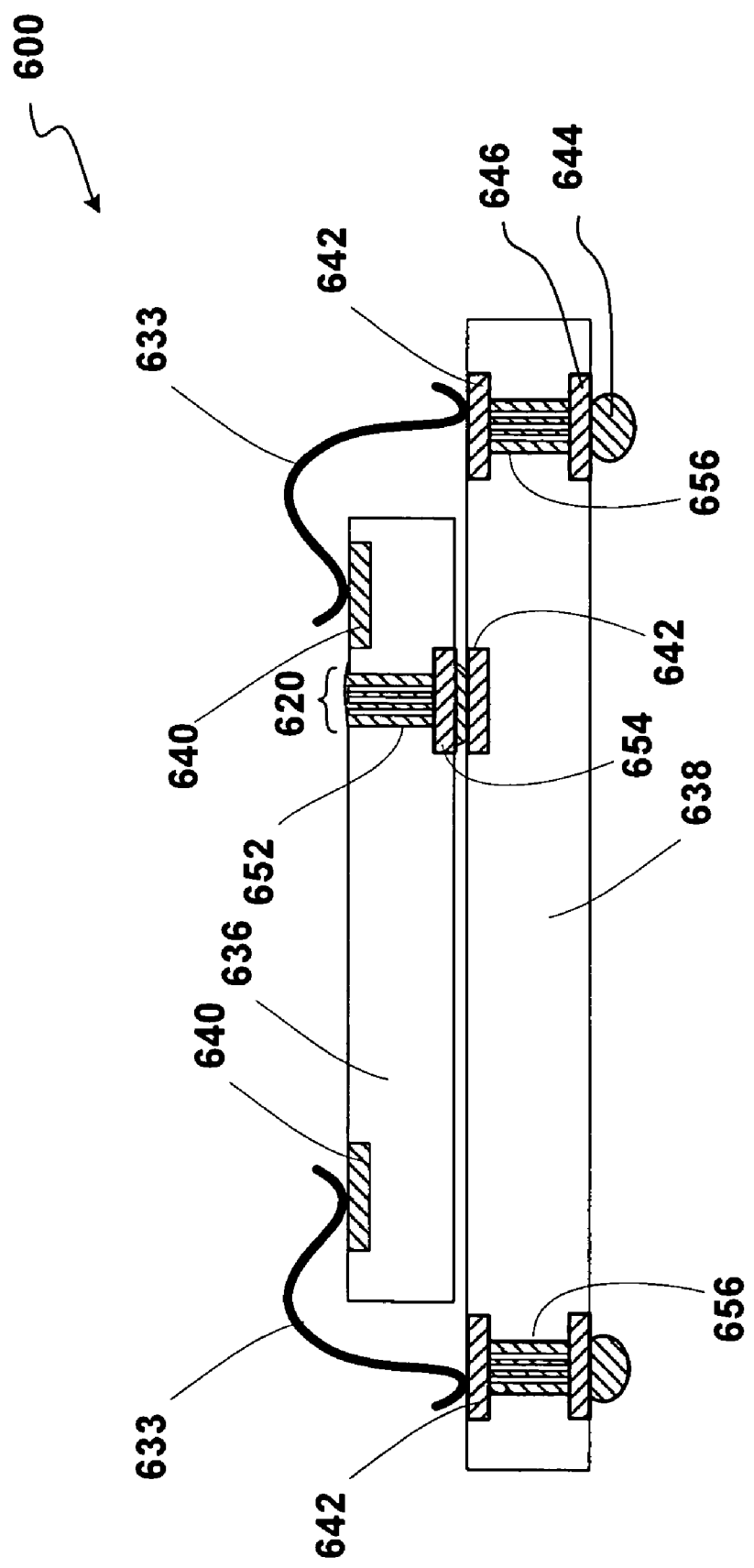
FIG. 6 is a cross-section elevation of a structure that contains a through-die carbon nanotube array according to an embodiment.

FIG. 6 is a cross-section elevation of a structure 600 that contains a through-die carbon nanotube array according to an embodiment. The structure 600 includes a die 636 that is wire bonded to a mounting substrate 638. A die bond pad 640 and a mounting substrate bond pad 642 are also depicted. A bond wire 633 couples the die 636 to the mounting substrate 638. The mounting substrate 638 is also bumped with a board-side electrical bump 644, which is in contact with a board-side bond pad 446.

A solder-filled through-die via (TDV) 652 is depicted with a CNT array 620 disposed therein. The CNT array 620 is depicted as having been grown from a backside bond pad 654 according to an embodiment. In an embodiment, however a CNT-containing, solder-filled TDV can be inserted through the die 636, such that the backside bond pad 654 is not needed. The CNT array 620 is depicted in simplified manner with only carbon nanotubes for clarity. In an embodiment the carbon nanotubes have a length range from about 1 μm to about 100 μm. The width of a given CNT is in a range from about 15 nm to about 25 nm according to an embodiment.

In an embodiment, a solder-filled through-die through-board via (TBV) 656 is prepared. In this embodiment, the TBV 656 can be a power or signal coupling that facilitates the high current-density applications of this disclosure.

Figure 7:
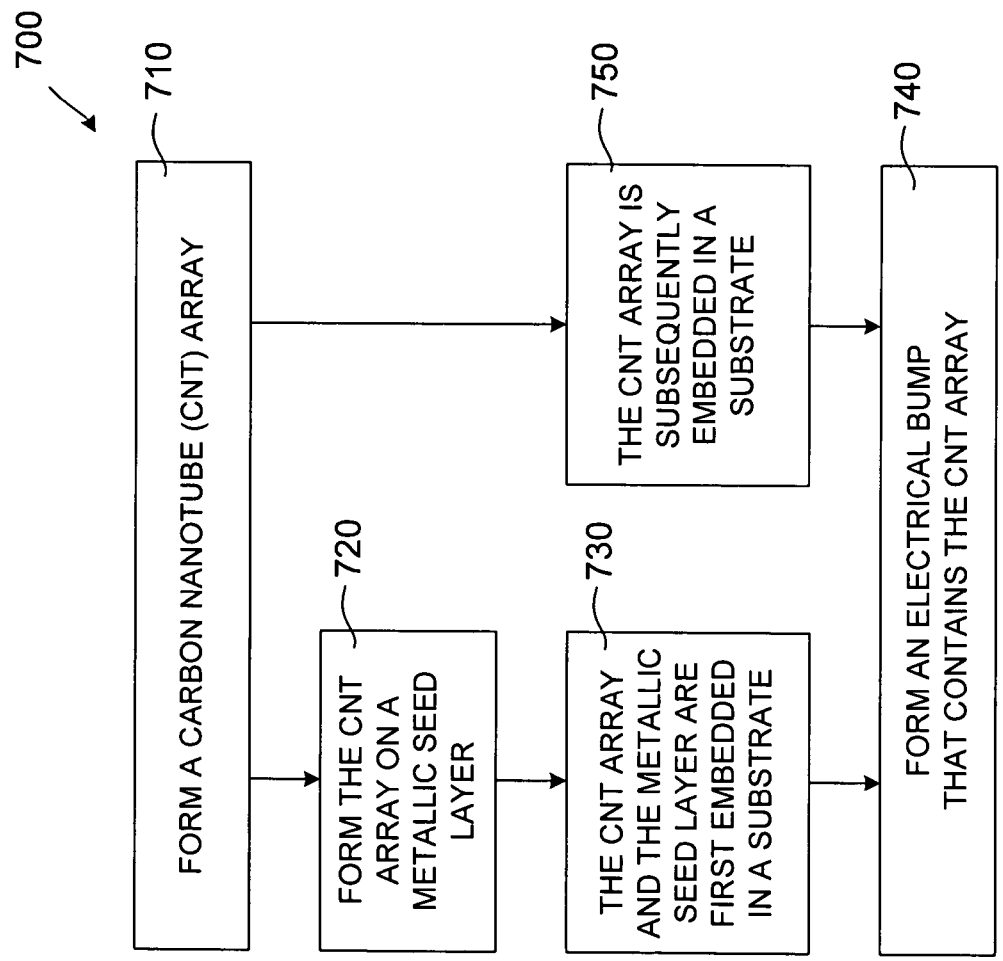
FIG. 7 is a flow chart that describes process and method flow embodiments.

FIG. 7 is a flow chart 700 that describes process flow embodiments. At 710, the process includes forming a CNT array.

At 720, the process includes forming the CNT array on a metallic seed layer. For example, the metallic seed layer 118 depicted in FIG. 1 can be the structure that is used.

At 730, the process includes forming the metallic seed layer and the CNT array to be embedded within a substrate. By way of non-limiting example, the reduced-thickness substrate 111 depicted in FIG. 1D and FIG. 1E is the process of embedding.

At 740, the process includes forming an electrical bump that contains the CNT array.

At 750, the process includes first forming the metallic seed layer, followed by embedding the metallic seed layer in a substrate By way of non-limiting example, the substrate 337 depicted in FIGS. 3E, 3F, and 3G is the process of subsequent embedding. In an embodiment, the process includes commencing at 710, flowing through 750, and then flowing to 740.

Figure 8:
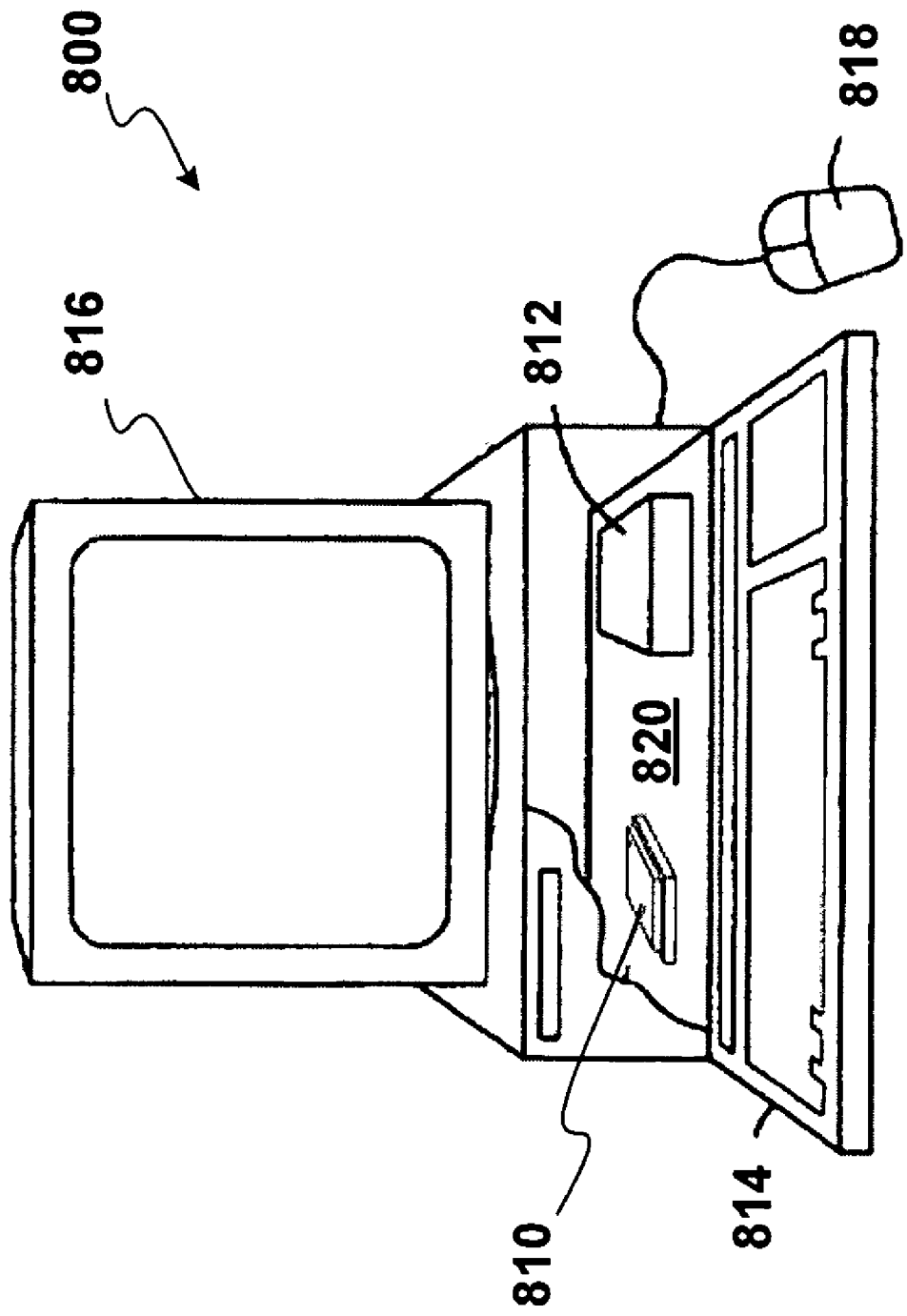
FIG. 8 is a cut-away elevation that depicts a computing system according to an embodiment.

FIG. 8 is a cut-away elevation that depicts a computing system according to an embodiment. One or more of the foregoing embodiments of the CNT-containing electrical bump, the CNT-containing TDV, the CNT-containing TBV, or a combination thereof may be utilized in a computing system, such as a computing system 800 of FIG. 8. Hereinafter any embodiments that include a CNT-containing electrical bump, a CNT-containing TDV, a CNT-containing TBV, or a combination thereof alone or in combination, with any other embodiment can be referred to as an embodiment(s) configuration.

The computing system 800 includes at least one processor (not pictured), which is enclosed in a package 810, a data storage system 812 such as dynamic random-access memory, at least one input device such as a keyboard 814, and at least one output device such as a monitor 816, for example. The computing system 800 includes a processor that processes data signals, and may include, for example, a microprocessor, available from Intel Corporation. In addition to the keyboard 814, the computing system 800 can include another user input device such as a mouse 818, for example.

For purposes of this disclosure, a computing system 800 embodying components in accordance with the claimed subject matter may include any system that utilizes a microelectronic device system, which may include, for example, at least one of the CNT-containing electrical bump, the CNT-containing TDV, the CNT-containing TBV, or a combination thereof that is coupled to data storage such as dynamic random access memory (DRAM), polymer memory, flash memory, and phase-change memory. In this embodiment, the embodiment(s) is coupled to any combination of these functionalities by being coupled to a processor. In an embodiment, however, an embodiment(s) configuration set forth in this disclosure is coupled to any of these functionalities. For an example embodiment, data storage includes an embedded DRAM cache on a die. Additionally in an embodiment, the embodiment(s) configuration that is coupled to the processor (not pictured) is part of the system with an embodiment(s) configuration that is coupled to the data storage of the DRAM cache. Additionally in an embodiment, an embodiment(s) configuration is coupled to the data storage 812.

In an embodiment, the computing system 800 can also include a die that contains a digital signal processor (DSP), a micro controller, an application specific integrated circuit (ASIC), or a microprocessor. In this embodiment, the embodiment(s) configuration is coupled to any combination of these functionalities by being coupled to a processor. For an example embodiment, a DSP (not pictured) is part of a chipset that may include a stand-alone processor and the DSP as separate parts of the chipset on the board 820. In this embodiment, an embodiment(s) configuration is coupled to the DSP, and a separate embodiment(s) configuration may be present that is coupled to the processor in the package 810. Additionally in an embodiment, an embodiment(s) configuration is coupled to a DSP that is mounted on the same board 820 as the package 810. It can now be appreciated that the embodiment(s) configuration can be combined as set forth with respect to the computing system 800, in combination with an embodiment(s) configuration as set forth by the various embodiments of the CNT-containing electrical bump, the CNT-containing TDV, the CNT-containing TBV, or a combination thereof within this disclosure and their equivalents.

Figure 9:
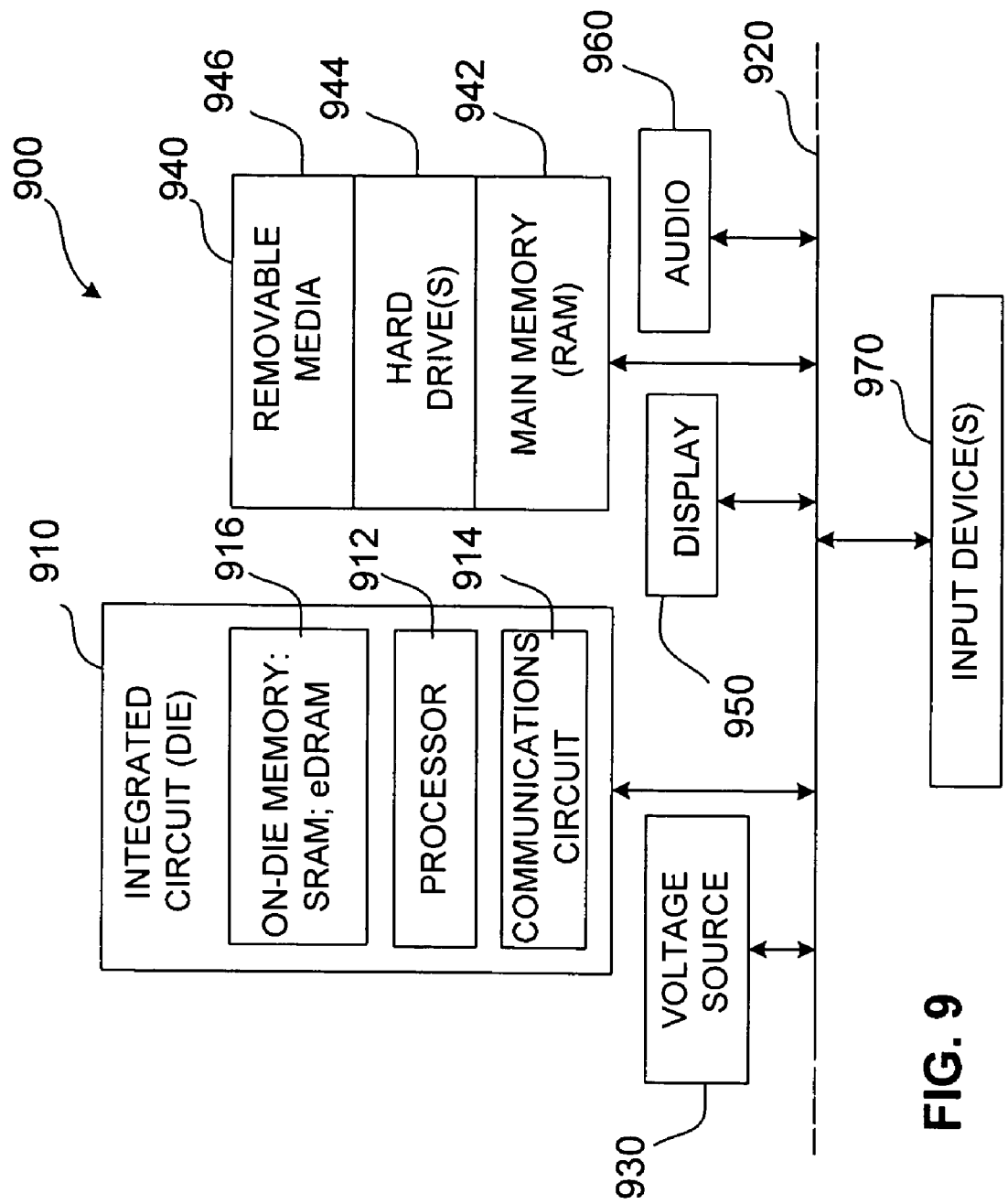
FIG. 9 is a schematic of an electronic system according to an embodiment.

FIG. 9 is a schematic of an electronic system according to an embodiment. The electronic system 900 as depicted can embody the computing system 800 depicted in FIG. 8 along with at least one of the CNT-containing electrical bump, the CNT-containing TDV, the CNT-containing TBV, or a combination thereof. The electronic system 900 is depicted more generically. The electronic system 900 incorporates at least one electronic assembly 910, such as an integrated circuit package illustrated in FIGS. 7 and 8. In an embodiment, the electronic system 900 is a computer system that includes a system bus 920 to electrically couple the various components of the electronic system 900. The system bus 920 is a single bus or any combination of busses according to various embodiments. The electronic system 900 includes a voltage source 930 that provides power to the integrated circuit 910. In some embodiments, the voltage source 930 supplies current to the integrated circuit 910 through the system bus 920.

The integrated circuit 910 is electrically coupled to the system bus 920 and includes any circuit, or combination of circuits, according to an embodiment. In an embodiment, the integrated circuit 910 includes a processor 912 that can be of any type. As used herein, the processor 912 means any type of circuit such as, but not limited to, a microprocessor, a microcontroller, a graphics processor, a digital signal processor, or another processor. Other types of circuits that can be included in the integrated circuit 910 are a custom circuit or an ASIC, such as a communications circuit 914 for use in wireless devices such as cellular telephones, pagers, portable computers, two-way radios, and similar electronic systems. In an embodiment, the processor 910 includes on-die memory 916 such as SRAM. In an embodiment, the processor 910 includes on-die memory 916 such as eDRAM.

In an embodiment, the electronic system 900 also includes an external memory 940 that in turn may include one or more memory elements suitable to the particular application, such as a main memory 942 in the form of RAM, one or more hard drives 944, and/or one or more drives that handle removable media 946, such as diskettes, compact disks (CDs), digital video disks (DVDs), flash memory keys, and other removable media known in the art.

In an embodiment, the electronic system 900 also includes a display device 950, an audio output 960. In an embodiment, the electronic system 900 includes an input device(s) 970, such as a keyboard, mouse, trackball, game controller, microphone, voice-recognition device, or any other device that inputs information into the electronic system 900.

As shown herein, integrated circuit 910 can be implemented in a number of different CNT array-containing embodiments, including an electronic package, an electronic system, a computer system, one or more methods of fabricating an integrated circuit, and one or more methods of fabricating an electronic assembly that includes the integrated circuit and the CNT-containing electrical bump as set forth herein in the various embodiments and their art-recognized equivalents. The elements, materials, geometries, dimensions, and sequence of operations can all be varied to suit particular packaging requirements.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process comprising:
   forming a metallic seed layer upon a substrate first surface;
   forming a carbon nanotube (CNT) array upon the metallic seed layer;
   impregnating the CNT array with an electrical-bump solder; and
   forming an electrical bump, wherein the electrical bump has impregnated the CNT array with the electrical-bump solder, wherein the substrate includes a substrate second surface that is parallel planar with the substrate first surface, the process further including exposing the metallic seed layer from the side of the substrate second surface.

2. The process of claim 1, wherein forming the metallic seed layer is preceded by forming an anodized aluminum oxide (AAO) array upon the substrate; and wherein forming the metallic seed layer is carried out within a recess in the AAO array.

3. The process of claim 1, wherein forming the metallic seed layer is preceded by forming a recess in a dielectric film upon the substrate; and wherein forming the metallic seed layer is carried out within the recess in the dielectric film.

4. The process of claim 1, wherein forming the metallic seed layer is preceded by forming a prominence upon the substrate; and wherein forming the metallic seed layer is carried out upon the prominence.

5. The process of claim 1, wherein forming the CNT array upon the metallic seed layer is carried out by a chemical vapor deposition process.

6. The process of claim 1, wherein exposing the metallic seed layer from the side of the substrate second surface is achieved by backgrinding the substrate second surface.

7. A process comprising:
forming a metallic seed layer upon a substrate first surface;
forming a carbon nanotube (CNT) array upon the metallic seed layer;
impregnating the CNT array with an electrical-bump solder; and forming an electrical bump, wherein the electrical bump has impregnated the CNT array with the electrical-bump solder, wherein the substrate includes a substrate second surface that is parallel planar with the substrate first surface, the process further including exposing the metallic seed layer from the side of the substrate second surface by embrittling the substrate above the second surface and below the first surface, followed by delaminating the substrate.

8. The process of claim 7, the process further including:
wherein delaminating the substrate achieves a substrate subsequent second surface; and
backgrinding the substrate subsequent second surface.

9. The process of claim 1, further including assembling the electrical bump to a microelectronic device bond pad.

10. A process comprising:
forming an anodized aluminum oxide (AAO) array upon a substrate;
forming a recess in a dielectric film upon the substrate;
forming a metallic seed layer upon a first surface of the substrate within a recess in the AAO array;
forming a carbon nanotube (CNT) array upon the metallic seed layer;
impregnating the CNT array with an electrical-bump solder; and
forming an electrical bump, wherein the electrical bump has impregnated the CNT array with the electrical-bump solder, wherein the substrate includes a substrate second surface that is parallel planar with the substrate first surface, the process further including exposing the metallic seed layer from the side of the substrate second surface.

11. The process of claim 10, wherein forming the CNT array upon the metallic seed layer is carried out by a chemical vapor deposition process.

12. The process of claim 10, wherein exposing the metallic seed layer from the side of the substrate second surface is achieved by backgrinding the substrate second surface.

13. A process comprising:
forming an anodized aluminum oxide (AAO) array upon a substrate;
forming a recess in a dielectric film upon the substrate;
forming a metallic seed layer upon a first surface of the substrate within a recess in the AAO array;
forming a carbon nanotube (CNT) array upon the metallic seed layer;
impregnating the CNT array with an electrical-bump solder; and
forming an electrical bump, wherein the electrical bump has impregnated the CNT array with the electrical-bump solder, wherein the substrate includes a substrate second surface that is parallel planar with the substrate first surface, the process further including exposing the metallic seed layer from the side of the substrate second surface by embrittling the substrate above the second surface and below the first surface, followed by delaminating the substrate.

14. The process of claim 13, the process further including:
backgrinding the substrate subsequent second surface.

15. The process of claim 10, further including assembling the solder bump to a microelectronic device bond pad.

16. A process comprising:
forming prominence upon a substrate;
forming a metallic seed layer upon the prominence;
forming a carbon nanotube (CNT) array upon the metallic seed layer;
impregnating the CNT array with an electrical-bump solder; and
forming an electrical bump, wherein the electrical bump has impregnated the CNT array with the electrical-bump solder, wherein the substrate includes a substrate second surface that is parallel planar with the substrate first surface, the process further including exposing the metallic seed layer from the side of the substrate second surface by embrittling the substrate above the second surface and below the first surface, followed by delaminating the substrate.

17. A process comprising:
forming prominence upon a substrate;
forming a metallic seed layer upon the prominence;
forming a carbon nanotube (CNT) array upon the metallic seed layer;
impregnating the CNT array with an electrical-bump solder; and forming an electrical bump, wherein the substrate includes a substrate second surface that is parallel planar with the substrate first surface, the process further including:
delaminating the substrate to achieve a substrate subsequent second surface; and
backgrinding the substrate subsequent second surface.

18. The process of claim 16, further including assembling the solder bump to a microelectronic device bond pad.

19. A process comprising:
forming a recess in a dielectric film upon the substrate;
forming a metallic seed layer upon a substrate first surface, wherein forming the metallic seed layer is carried out within the recess in the dielectric film;
forming a carbon nanotube (CNT) array upon the metallic seed layer;
impregnating the CNT array with an electrical-bump solder;
forming an electrical bump, wherein the electrical bump has impregnated the CNT array with the electrical-bump solder;

wherein the substrate includes a substrate second surface that is parallel planar with the substrate first substrate, the process further including:

exposing the metallic seed layer from the side of the substrate second surface by embrittling the substrate above the second surface and below the first surface; delaminating the substrate to achieve a substrate subsequent second surface; and backgrinding the substrate subsequent second surface.

20. The process of claim 19, further including assembling the electrical bump to a microelectronic device bond pad.

* * * * *